United States Patent
Ramirez et al.

(10) Patent No.: US 10,082,594 B2
(45) Date of Patent: Sep. 25, 2018

(54) MAGNET ARRAYS FOR MAGNETIC RESONANCE MEASUREMENTS

(71) Applicants: Marc Stephen Ramirez, Missouri City, TX (US); Stanislav Wilhelm Forgang, Houston, TX (US); Babak Kouchmeshky, Kingwood, TX (US)

(72) Inventors: Marc Stephen Ramirez, Missouri City, TX (US); Stanislav Wilhelm Forgang, Houston, TX (US); Babak Kouchmeshky, Kingwood, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 625 days.

(21) Appl. No.: 14/680,254

(22) Filed: Apr. 7, 2015

(65) Prior Publication Data

US 2016/0299249 A1 Oct. 13, 2016

(51) Int. Cl.
*G01V 3/32* (2006.01)
*G01R 33/34* (2006.01)
(Continued)

(52) U.S. Cl.
CPC ......... *G01V 3/32* (2013.01); *G01R 33/3808* (2013.01); *G01R 33/383* (2013.01)

(58) Field of Classification Search
CPC .......... G01V 3/32–3/34; G01R 33/38–33/389; E21B 47/10–47/1025
(Continued)

(56) References Cited

U.S. PATENT DOCUMENTS 4,825,162 A 4/1989 Roemer et al.
5,055,787 A * 10/1991 Kleinberg ............... G01V 3/32
324/303

(Continued)

FOREIGN PATENT DOCUMENTS

EP 1344090 A1 9/2003
WO WO0250573 A1 6/2002
(Continued)

OTHER PUBLICATIONS

Bjork et al.; The efficiency and the demagnetization field of a general Halbach cylinder; Feb. 17, 2015; Journal of Magnetism and Magnetic Materials; vol. 384, 128-132, 2015; p. 1-5.*

(Continued)

*Primary Examiner* — Melissa Koval
*Assistant Examiner* — Rahul Maini
(74) *Attorney, Agent, or Firm* — Cantor Colburn LLP (57) ABSTRACT

Nuclear magnetic resonance apparatuses and methods for estimating properties of an earth formation are provided. An apparatus includes a carrier configured to be deployed in a borehole, at least one transmitting assembly configured to generate an oscillating magnetic field in a volume of interest within the earth formation, at least one receiving assembly configured to detect a nuclear magnetic resonance (NMR) signal originating in the volume of interest; and a magnet assembly configured to generate a static magnetic field in the formation from a primary side of the magnet assembly. The magnet assembly includes an array of longitudinally elongated magnets having a rotating pattern of magnetic orientations, the array configured to generate the static magnetic field in the volume of interest, and the static magnetic field strength is higher at the primary side than the field strength at a side of the magnet assembly that is opposite the primary side.

19 Claims, 7 Drawing Sheets (51) Int. Cl.
*G01R 33/38* (2006.01)
*G01R 33/383* (2006.01)

(58) Field of Classification Search
USPC .......................................... 324/303; 702/6–13
See application file for complete search history.

(56) References Cited

U.S. PATENT DOCUMENTS

| | | | |
|---|---|---|---|
| 6,111,408 | A | 8/2000 | Blades et al. |
| 6,348,792 | B1 | 2/2002 | Beard et al. |
| 6,400,149 | B1 | 6/2002 | Luong et al. |
| 6,411,087 | B1 | 6/2002 | Fan et al. |
| 6,577,125 | B2 | 6/2003 | Prammer et al. |
| 6,781,371 | B2 | 8/2004 | Taherian et al. |
| 7,012,426 | B2 | 3/2006 | Edwards et al. |
| 7,733,086 | B2 | 6/2010 | Prammer et al. |
| 7,906,962 | B2 | 3/2011 | Han et al. |
| 8,324,895 | B2 * | 12/2012 | Rottengatter ............ G01V 3/32 324/303 |
| 8,519,708 | B2 | 8/2013 | Prado et al. |
| 8,816,684 | B2 * | 8/2014 | Walsh ...................... G01V 3/32 324/303 |
| 9,260,941 | B2 * | 2/2016 | Linklater ................. E21B 31/06 |
| 2002/0075000 | A1 | 6/2002 | Prammer et al. |
| 2004/0140800 | A1 | 7/2004 | Madio et al. |
| 2004/0183533 | A1 | 9/2004 | Edwards et al. |
| 2005/0017715 | A1 | 1/2005 | Prammer et al. |
| 2008/0136410 | A1 | 6/2008 | Song et al. |
| 2009/0128144 | A1 | 5/2009 | Freedman et al. |
| 2011/0241667 | A1 | 10/2011 | Blumich et al. |
| 2013/0000884 | A1 | 1/2013 | Linklater |
| 2013/0063142 | A1 | 3/2013 | Hopper et al. |
| 2013/0093422 | A1 | 4/2013 | Morys et al. |
| 2014/0084927 | A1 | 3/2014 | Walsh et al. |
| 2014/0225607 | A1 | 8/2014 | Edwards et al. |
| 2015/0061664 | A1 | 3/2015 | Reiderman et al. |
| 2016/0208579 | A1 * | 7/2016 | Delzell ................... E21B 33/12 |

FOREIGN PATENT DOCUMENTS

| | | |
|---|---|---|
| WO | WO2009029241 A1 | 3/2009 |
| WO | WO2009061481 A1 | 5/2009 |
| WO | WO2014052762 A1 | 4/2014 |
| WO | 2015016858 A1 | 2/2015 |

OTHER PUBLICATIONS

Notification of Transmittal of the International Search Report and the Written Opinion of the International Searching Authority, or the Declaration; PCT/US2016/026185; dated Jul. 12, 2016; 14 pages.
Chen, et al.; "Magnetic Resonance for Downhole Complex-Lithology Earth Formation Evaluation"; New Journal of Physics 13; 2011; IOP Publishing LTD and Deutsche Physikalische Gesellschaft; 15 pages.

* cited by examiner

MAGNET ARRAYS FOR MAGNETIC RESONANCE MEASUREMENTS

BACKGROUND

Understanding the characteristics of geologic formations and fluids located therein is important for effective hydrocarbon exploration and production. Formation evaluation relies on accurate petrophysical interpretation derived from a diverse set of logging technologies. One such technology, nuclear magnetic resonance (NMR), can be used to estimate formation characteristics such as mineralogy-independent porosity and permeability of rocks, to perform fluid typing and determine fluid volumes, and to estimate fluid characteristics such as viscosity. The design of NMR logging tools is crucial for achieving high performance, high measurement accuracy, and sufficient reliability in extreme high-temperature high-pressure environments. NMR-based tools can be conveyed into a borehole during drilling (e.g., logging-while-drilling) or after drilling (e.g., wireline logging).

SUMMARY

An embodiment of a nuclear magnetic resonance apparatus for estimating properties of an earth formation includes: a carrier configured to be deployed in a borehole in the earth formation; at least one transmitting assembly disposed in the carrier and configured to generate an oscillating magnetic field in a volume of interest within the earth formation; at least one receiving assembly disposed in the carrier and configured to detect a nuclear magnetic resonance (NMR) signal originating in the volume of interest; and a magnet assembly disposed in the carrier and configured to generate a static magnetic field in the formation from a primary side of the magnet assembly, the magnet assembly including an array of longitudinally elongated magnets having a rotating pattern of magnetic orientations, the array configured to generate the static magnetic field in the volume of interest, the static magnetic field strength being higher at the primary side than the magnetic field strength at a side of the magnet assembly that is opposite the primary side.

An embodiment of a method of estimating properties of an earth formation includes: deploying a carrier into a borehole in the earth formation; generating an oscillating magnetic field in a volume of interest within the earth formation by at least one transmitting assembly disposed in the carrier; generating a static magnetic field by a magnet assembly disposed in the carrier, the static magnetic field generated from a primary side of the magnet assembly into the volume of interest, the magnet assembly including an array of longitudinally elongated magnets having a rotating pattern of magnetic orientations, the static magnetic field strength being higher at the primary side than the magnetic field strength at a side of the magnet assembly that is opposite the primary side; detecting a nuclear magnetic resonance (NMR) signal by at least one receiver assembly; and estimating the properties of the earth formation based on the detected signal.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

Apparatuses and methods for measuring characteristics of an earth formation using magnetic resonance techniques are described herein. Embodiments of a nuclear magnetic resonance (NMR) apparatus or tool include magnet assemblies configured to generate static magnetic fields, transmitter assemblies configured to generate oscillating magnetic fields, and receiver assemblies configured for detecting NMR signals emanating from the formation. The NMR apparatus, in one embodiment, is a wireline or logging-while-drilling (LWD) device configured to take measurements at a series of depths or locations.

Embodiments of a magnet assembly include an array of distinct magnets (e.g., permanent magnets), with each magnet having a selected magnetic orientation that is different than the orientation of adjacent magnets. The array forms a pattern of orientations that results in a static magnetic field that is relatively strong at one side of the magnet assembly (e.g., the side directed toward the formation during measurements) and relatively weak or minimal at another (e.g., opposite) side of the magnet assembly (e.g., the side that is most proximal to the largest unoccupied portion of the borehole during measurements). An exemplary pattern of orientations is a rotating pattern, similar to those found in Halbach magnet arrays.

When deployed in a borehole and actuated to take NMR measurements of a formation, the magnet array generates a static external magnetic field that extends into a volume of interest in the formation, and that is weaker or minimal on the side adjacent to the unoccupied portion borehole. Embodiments described herein provide various benefits, such as increased depth of investigation into the formation and increased signal-to-noise ratio (SNR) of the collected formation data, which could allow faster logging and higher vertical resolutions by limiting the number of times data must be averaged to achieve adequate SNR for subsequent post-processing. An additional benefit, due to reduction or minimization of the static magnetic fields toward the unoccupied borehole space (i.e., space unoccupied by the apparatus or tool), is the elimination of the need to include additional RF antennas for spoiling the NMR signal originating in the borehole, thus reducing complexity and improving reliability of the NMR apparatus.

The magnet array may be a linear array, a circumferential array or a partially circumferential array of magnets that generate a strong magnetic field on a primary side with a weak or minimal magnetic field strength on an opposite (or adjacent) side relative to the location of the primary field. In embodiments that include a circumferential or semi-circumferential array, the array is configured so that the magnetic field is strongest toward an outside area of the array while being weaker or minimal in the internal region and/or center of the array. Some circumferential or semi-circumferential configurations can be considered to form an "inverted Halbach" magnet array, in that the magnetic field strength is greatest in an external volume relative to the array, which is in contrast to other circumferential Halbach arrangements that are configured to create strong and homogeneous magnetic fields within the encircling array (e.g., for sample analysis or magnetic resonance imaging).

Figure 1:
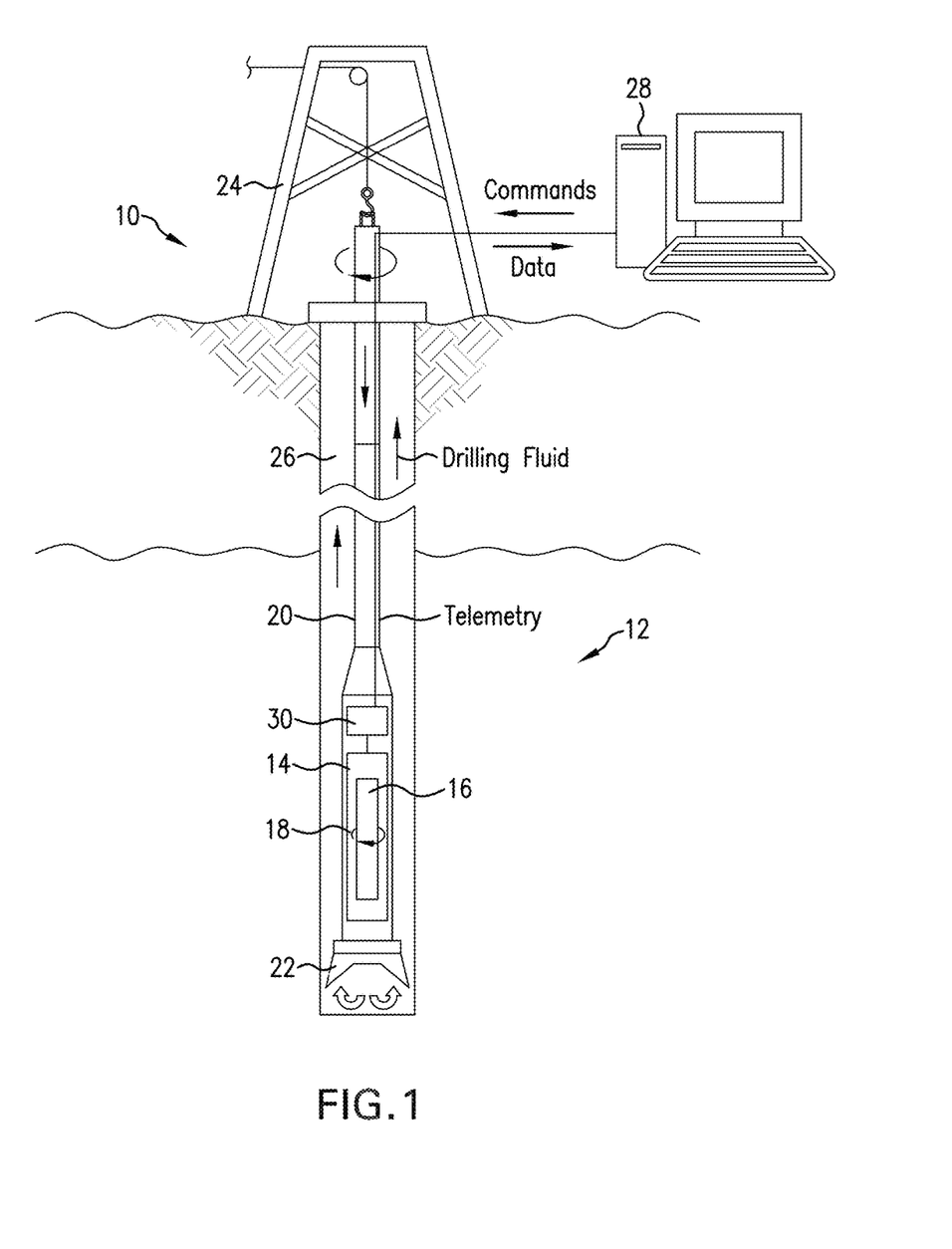
FIG. 1 depicts an embodiment of a formation measurement system that includes a nuclear magnetic resonance (NMR) measurement apparatus for logging while drilling.

FIG. 1 illustrates an exemplary embodiment of a downhole measurement, data acquisition, and/or analysis system 10 that includes devices or systems for in-situ measurement of characteristics of an earth formation 12. The system 10 includes a magnetic resonance apparatus such as a NMR tool 14. An example of the magnetic resonance apparatus is a logging-while-drilling (LWD) magnetic resonance tool. The tool 14 is configured to generate magnetic resonance data for use in estimating characteristics of a formation, such as porosity, irreducible water saturation, permeability, hydrocarbon content, and fluid viscosity.

An exemplary tool 14 includes a static magnetic field source 16 that magnetizes formation materials and a transmitter assembly 18 (e.g., an antenna or antenna assembly) that transmits RF energy or pulsed energy that provides an oscillating magnetic field in the formation. The transmitter assembly 18 may also serve the receive function, or distinct receiving antennas may be used for that purpose. It can be appreciated that the tool 14 may include a variety of components and configurations as known in the art of nuclear magnetic resonance or magnetic resonance imaging.

The tool 14 may be configured as a component of various subterranean systems, such as wireline well logging and LWD systems. For example, the tool 14 can be incorporated within a drill string 20 including a drill bit 22 or other suitable carrier and deployed downhole, e.g., from a drilling rig 24 into a borehole 26 during a drilling operation. The tool 14 is not limited to the embodiments described herein, and may be deployed in a carrier with alternative conveyance methods. A "carrier" as described herein means any device, device component, combination of devices, media and/or member that may be used to convey, house, support or otherwise facilitate the use of another device, device component, combination of devices, media, and/or member. Exemplary non-limiting carriers include drill strings of the coiled tube type, of the jointed pipe type, and any combination or portion thereof. Other carrier examples include casing pipes, wirelines, wireline sondes, slickline sondes, drop shots, downhole subs, bottom-hole assemblies, and drill strings.

In one embodiment, the tool 14 and/or other downhole components are equipped with transmission equipment to communicate ultimately to a surface processing unit 28. Such transmission equipment may take any desired form, and different transmission media and methods may be used, such as wired, fiber optic, and/or wireless transmission methods. Additional processing units may be deployed with the carrier. For example, a downhole electronics unit 30 includes various electronic components to facilitate receiving signals and collect data, transmitting data and commands, and/or processing data downhole. The surface processing unit 28, electronics 30, the tool 14, and/or other components of the system 10 include devices as necessary to provide for storing and/or processing data collected from the tool 14 and other components of the system 10. Exemplary devices include, without limitation, at least one processor, storage, memory, input devices, output devices, and the like.

In one embodiment, magnetic resonance measurements are performed by a nuclear magnetic resonance tool, which generates a static magnetic field ($B_0$) in a volume within the formation using one or more magnets (e.g., the magnetic field source 16). An oscillating (e.g., RF) magnetic field ($B_1$), which is at least substantially perpendicular to the static magnetic field, is generated in the volume with an RF antenna.

A receiving assembly detects the excited NMR signal and captures its relaxation back to thermal equilibrium. The signal originates from the net magnetization resulting from the superposition of signal from individual hydrogen protons in the formation fluid. These signals are formed using a series of spin echoes (i.e. resulting in an echo train), which are detected by the tool, numerically processed, and ultimately displayed in NMR logs. The amplitude of these spin echoes is detected as a function of time, allowing for detection of both the initial amplitude (i.e. for porosity measurement) and the signal decay, which can be used to derive other formation and fluid characteristics after the data inversion procedure.

When the magnetic moments of spin ½ nuclei, such as those of hydrogen nuclei, are exposed to a static magnetic field, they orient themselves at two angles (i.e. two energy levels) in respect to the static magnetic field and precess about the direction of the applied static magnetic field. At the relatively low static magnetic fields and high temperatures, typical for an NMR logging tool in an earth formation, the two energy levels have only slightly different populations, resulting in a very small net magnetization. Unfortunately the (static) net magnetization along the static magnetic field cannot be detected and requires the application of an RF field orthogonal to the static field to "tip" the net magnetization into the transverse plane where it precesses and generates a small alternating magnetic field that can be detected after application of rephasing pulses (also called refocusing pulses). The rate at which equilibrium is established in the net magnetization upon provision of a static magnetic field is characterized by the parameter $T_1$, also referred to as the spin-lattice relaxation time constant. Another parameter is the spin-spin relaxation time constant, $T_2$. Both, $T_1$ and $T_2$, are widely used to characterize the formation and the various fluids contained within the formation.

Figure 2:
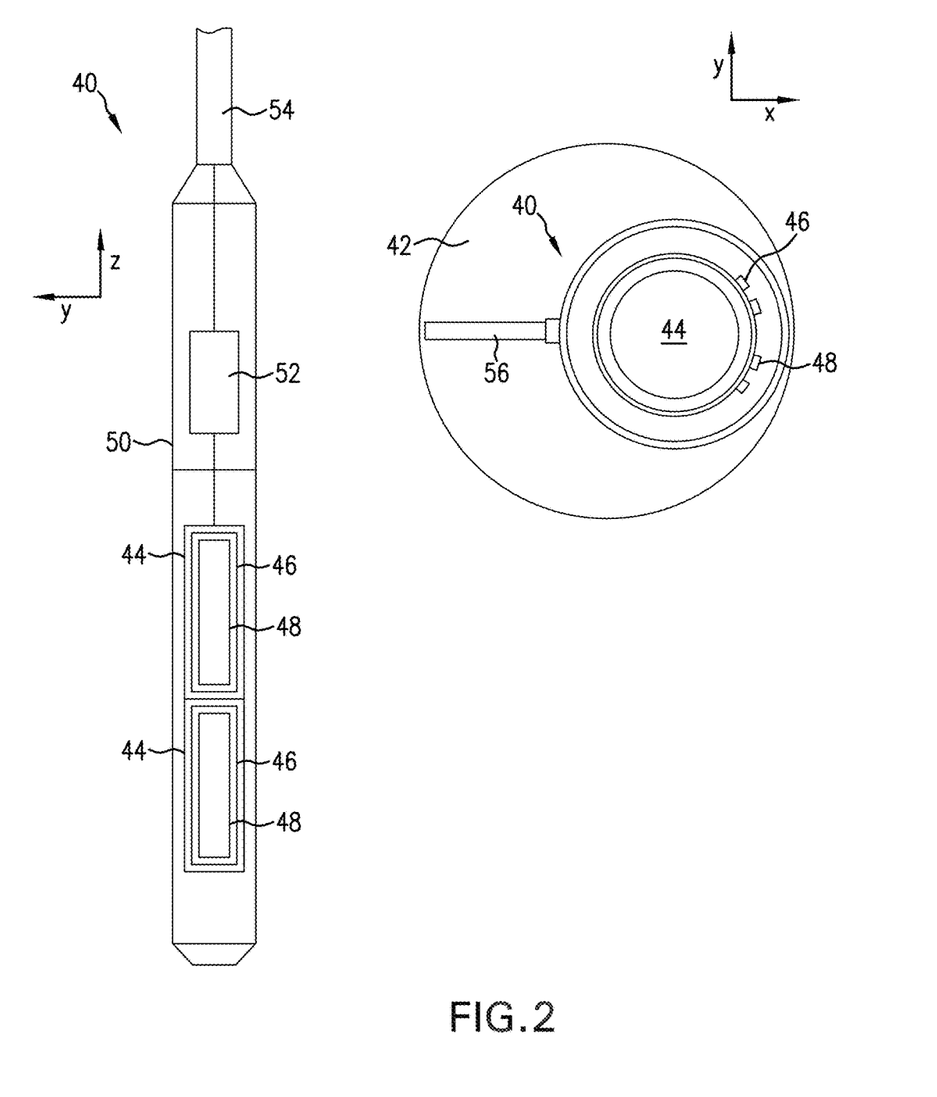
FIG. 2 depicts an embodiment of a NMR measurement apparatus for wireline logging.

FIG. 2 illustrates an example of a measurement apparatus configured as a NMR tool 40 for logging a previously-drilled formation. The tool 40 in this example is configured as a wireline tool that may be deployed in an open borehole 42. The static magnetic field source includes one or more magnet assemblies 44. The magnet assemblies 44 described in embodiments herein are permanent magnets, but are not so limited. In one embodiment, the magnet assemblies include electromagnets, a combination of permanent magnets and electromagnets, or magnets in combination with soft magnetic materials. One or more transmitter and/or receiver antennas are disposed proximal to each permanent magnet assembly 44. In this example, the tool 40 includes a transmitter assembly that includes an antenna in the form of a transmitting loop coil 46 and a receiving antenna in the form of a receiving loop coil 48. The antenna configurations are not limited to those described herein. For example, the antennas may be wrapped circumferentially around the magnet assembly or have a different shape or orientation. In other examples, a single coil or group of coils can be configured as both a transmitting and receiving device.

Other components of the tool include, for example, a sonde 50 or other carrier, and an electronics unit 52 connected to the coils 46 and 48, and/or to the magnet assembly 44. The electronics unit 52 and/or coils are connected to a surface location via a wireline 54 or other suitable telemetry system.

In this example, the tool 40 is a directional tool placed against the borehole wall and configured to generate strong magnetic fields in a volume of interest within the formation. The magnet assembly 44 is oriented so that the static magnetic fields are generally in the transverse (i.e. x-y) plane perpendicular to the length of the borehole and the longitudinal tool axis (the z-axis in this example), and is oriented generally toward the volume of interest. The transmitting coil 46 in this example is oriented generally in a plane perpendicular to the x-axis and emits an oscillating magnetic field at least substantially along the x-axis. The receiving coil 48 is oriented in the same direction as the transmitting coil 46. The coils are "side-looking" in that they are oriented to emit a magnetic field in a specific angular region about the longitudinal borehole (z-directed) axis. Components such as an extendable arm 56 may be included and actuated to urge the emitting side of the tool 40 toward the borehole wall, to increase the field strength in the volume of interest, and to reduce or eliminate the influence of borehole fluids on the acquired signal.

Figure 3:
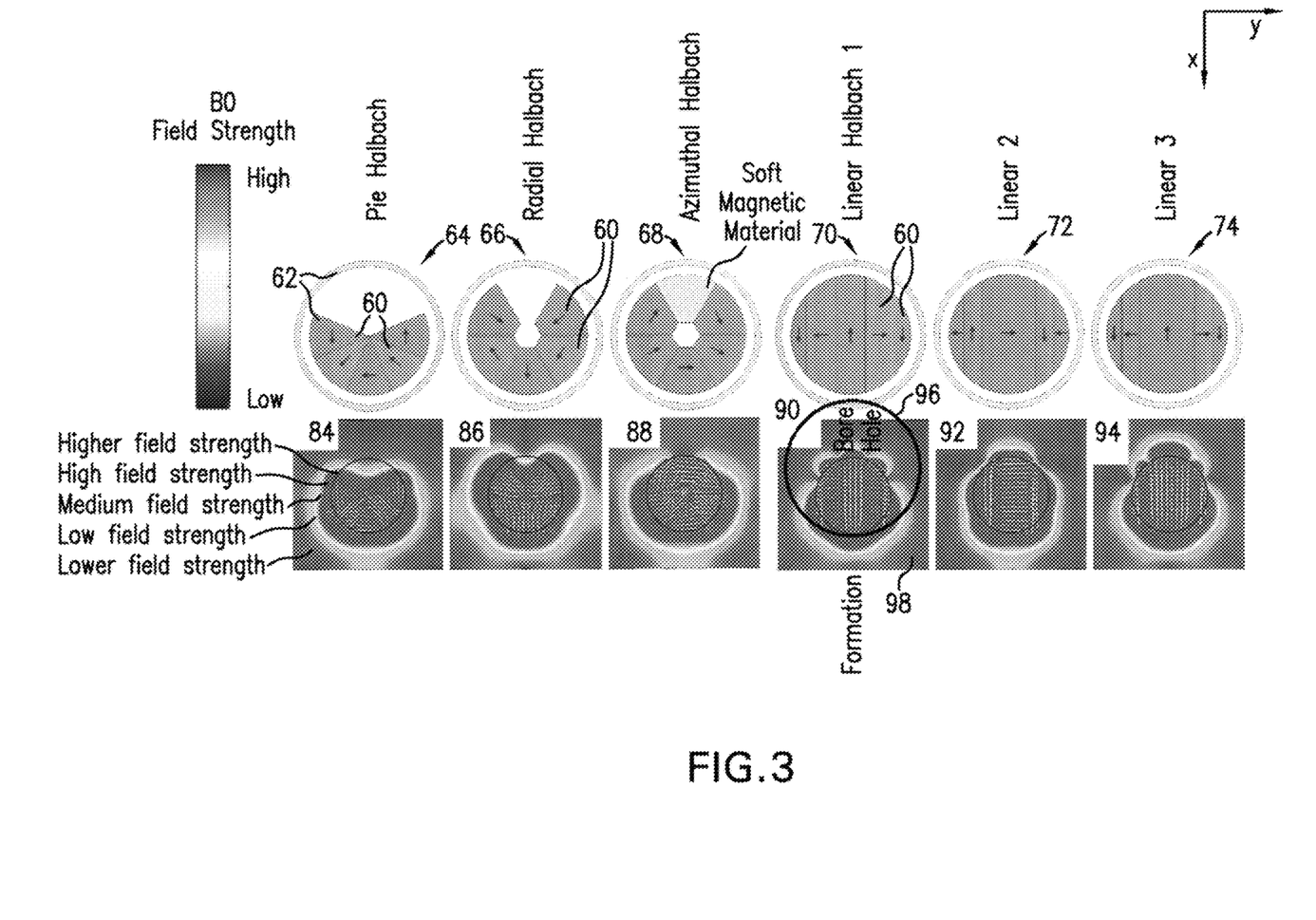
FIG. 3 depicts exemplary magnet array assemblies configured to generate a static magnetic field for NMR measurements along with examples of their associated fields.

FIG. 3 illustrates various embodiments of a magnet array assembly configured to generate a static magnetic field for magnetic resonance measurements. Each embodiment may be incorporated in a NMR measurement apparatus, e.g., as the magnet assembly 44, or in any other downhole magnetic resonance device or other device that involves generating a magnetic field in a formation or borehole. Each magnet assembly includes an array of permanent magnets 60, electromagnets, or a combination of permanent and/or electromagnets and core sections made from soft magnetic materials. The array of magnets 60 are configured to generate a static external magnetic field, $B_0$ in the formation.

Each array has a pattern of magnetic field orientations that results in a relatively strong magnetic field on one side of the array (a primary side) and a relatively weak or minimal magnetic field on an opposite or adjacent side of the array. Various examples of this rotating pattern are illustrated in FIG. 3, which shows a cross-section in an x-y plane perpendicular to the longitudinal axis (z-axis) of the measurement apparatus. The orientation of the magnetic field in this plane is shown for each magnet or magnet segment 60 by an arrow. As one progresses along each adjacent magnet 60 in the array (either linearly or along a circumferential path), the angular direction or phase of each magnet orientation changes according to a selected pattern. In one embodiment, the array has a rotating pattern of orientations similar to that of a Halbach array.

Exemplary patterns of the magnet array are shown in FIG. 3. The array geometry, magnetic orientations, and associated $B_0$ fields are shown for each example pattern. Although the assemblies shown here are cylindrical or semi-cylindrical, other shapes and cross-sections may be used. In one embodiment, as shown in FIG. 3, the magnets 60 in the array are placed in contact with one another and affixed to one another by any suitable means. In some examples, the magnets 60 form an array that is wrapped around a center of the assembly along a circumferential path that may be defined by the periphery 62 of the tool.

A first exemplary magnet assembly 64 includes an array of wedge or pie-shaped magnets 60 forming a full or partial cylinder. As the array 64 progresses in an angular direction along the circumference of the cylinder, the direction of orientation of each magnet 60 rotates such that each magnet array segment has an orientation that has a different angle (from adjacent magnet array segments) relative to a reference radial direction (e.g., the x-axis). In one embodiment, the array is partial, leaving a region of the array opposite the emitting side empty or containing a soft magnetic material to contain the fields and provide structural support for the assembly (e.g., an iron backbone section).

A second assembly 66 includes an array of magnets 60 arranged in a semi-circular pattern around an empty central portion, which can be used as a conduit for routing cables or fluid, or used to provide space for material that offers structural support. In this example, alternating magnets 60 in the array (i.e., every other magnet) have an orientation that is in the radial direction toward or away from the center of assembly 66, and the overall $B_0$ field pattern exits the tool and enters the formation along a primarily radial direction.

A third assembly 68, referred to as an azimuthal assembly, also includes an array of wedge-shaped magnets (although pie or similar shapes could also be used) arranged in a semi-circular array around a non-magnetic central segment. This assembly also has one array segment that is made from soft magnetic material, providing structural support and providing a magnetic path for containing the fields. In this example, the generated primary $B_0$ field in the front of the tool traverses a path that is azimuthal to the tool in the formation volume of interest, i.e., tangential to the circular path of the array and complementary to that produced in assembly 66.

FIG. 3 also shows embodiments of a linear array of magnets 60. Assemblies 70, 72 and 74 each include an array of magnets forming a solid cylinder, although similar configurations with soft magnetic materials, void spaces, and/or materials providing structural support can also be employed. The array of magnets 60 progresses linearly (e.g., along the y-axis), and the orientation of the magnets 60 in the array rotates as the magnets 60 progress from one end of the array to the other.

In each embodiment shown in FIG. 3, the magnet assembly is configured to generate a static magnetic field $B_0$ that is relatively strong and/or has a larger area on the side of the NMR measurement apparatus that is directed toward the volume of interest. In this way, the field can be applied to a region of the borehole wall and/or formation, while generating a smaller or minimal magnetic field strength adjacent to the primary field or directed toward the largest unoccupied portion of the borehole.

As an illustration, FIG. 3 shows the $B_0$ magnetic fields generated by each array, which are shaded to show the relative strength of the magnetic field. A legend indicating the relative field strength is included to show magnetic field gradients ranging from a higher magnetic field strength to a progressively weaker field strength. Magnetic field maps 84, 86, 88, 90, 92 and 94 represent the magnetic field of assemblies 64, 66, 68, 70, 72 and 74, respectively. In one embodiment, each assembly is disposed in a borehole 96 in a formation 98 as shown in FIG. 3, although the assemblies may be positioned in the borehole 96 at other locations or in other positions.

As shown, both the area covered by the static magnetic field $B_0$ and the strength of the $B_0$ field are significantly greater on one side of the array than on an opposite side of the array. In addition, array assemblies 64, 66, and 68 each show a decreased or minimal magnetic field strength in regions void of magnetic material, such as regions around the rotational axis of the array segments, and adjacent to the main region of unoccupied borehole space. These magnet assembly configurations allow NMR apparatuses or tools to be actuated to generate a strong magnetic field in a volume of interest outside of a borehole in the formation, while generating a relatively weak or minimal magnetic field in interior regions of the borehole.

Figure 4:
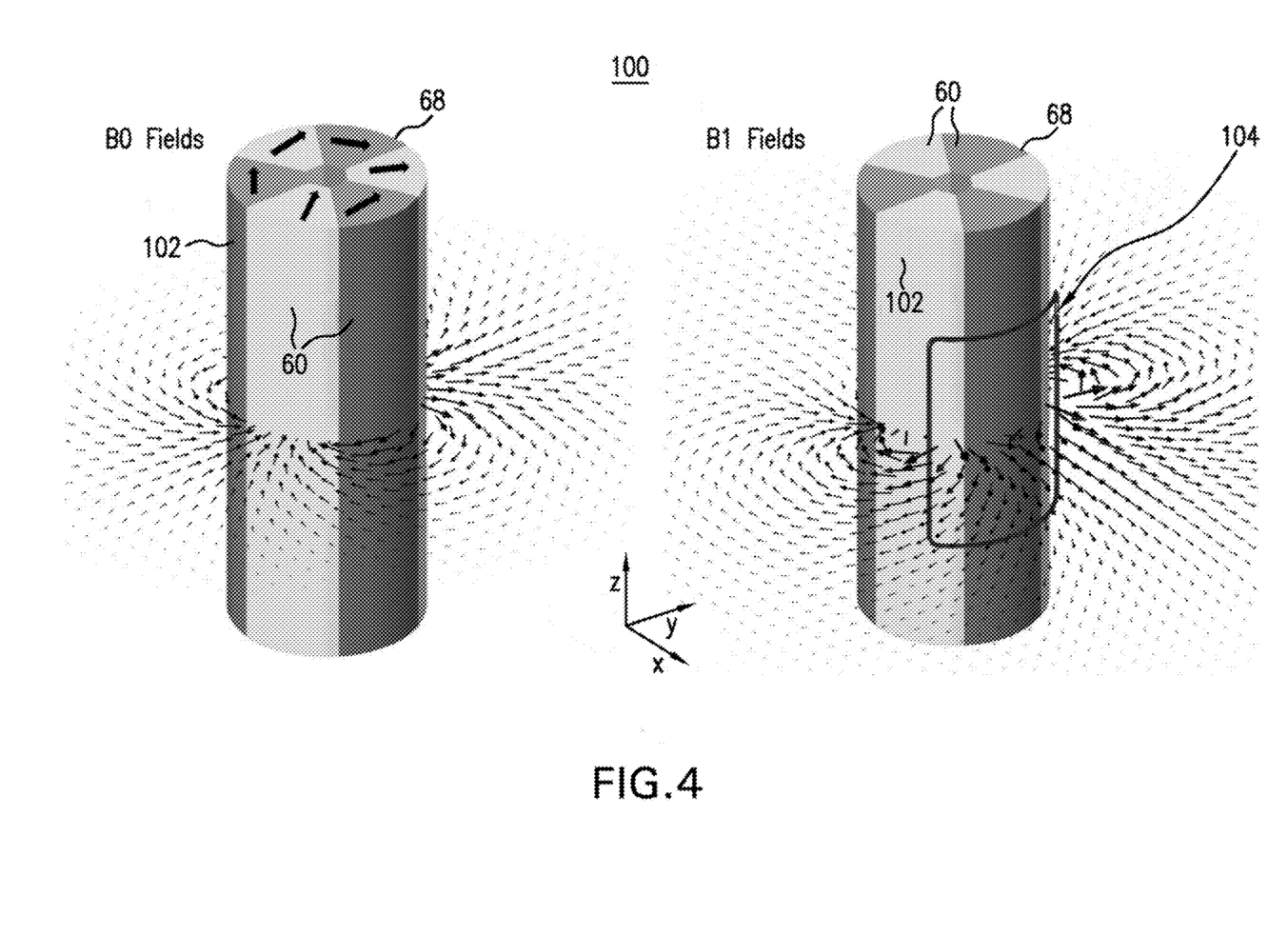
FIG. 4 depicts components of an embodiment of an NMR measurement apparatus, including a magnet array assembly and a transmit/receive antenna assembly (e.g., a radiofrequency (RF) coil) configured to generate an oscillating magnetic field in the formation and to perform signal reception.
Figure 5:
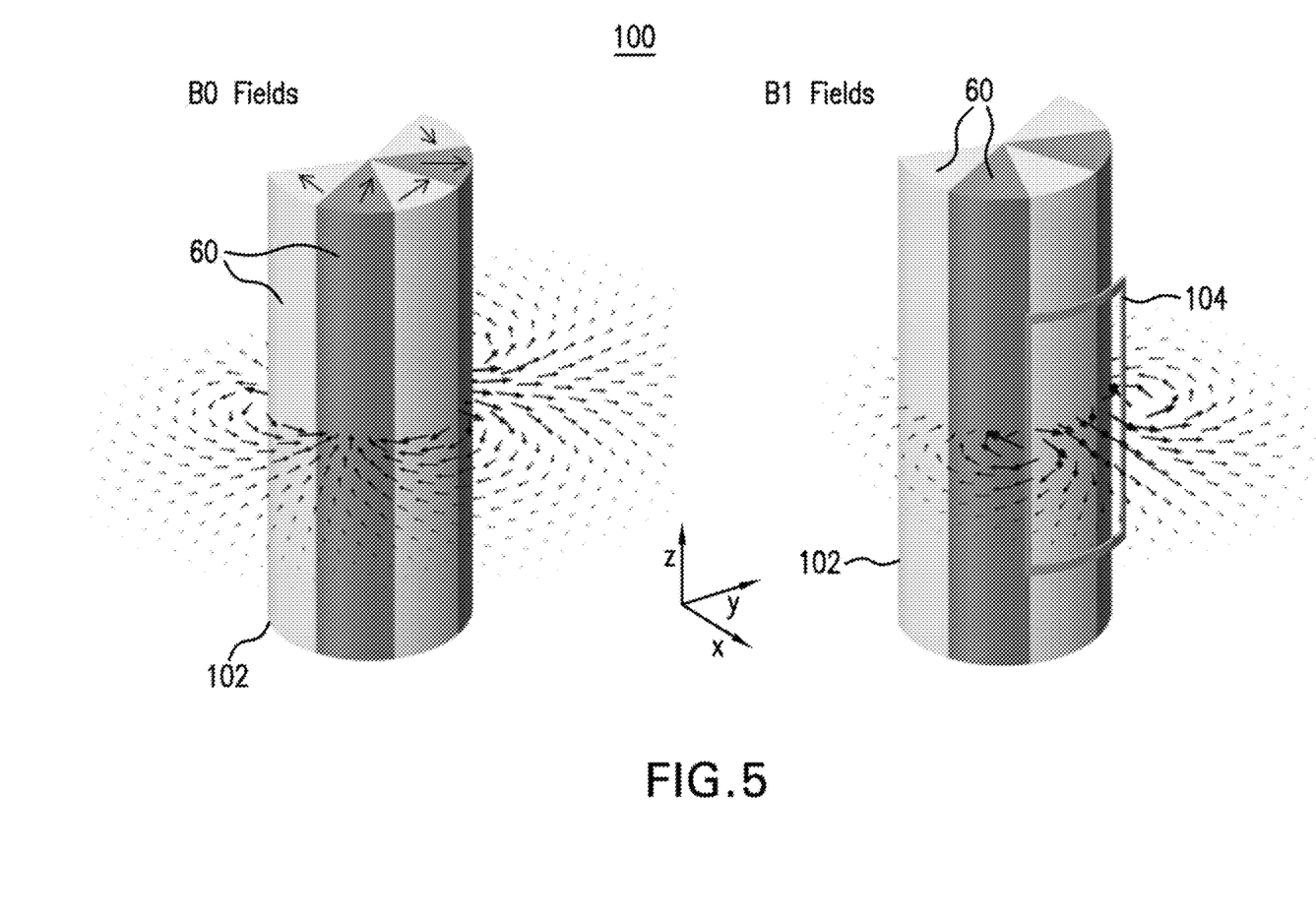
FIG. 5 depicts components of another embodiment of an NMR measurement apparatus, including a magnet assembly and a transmit/receive antenna assembly.

FIG. 4 and FIG. 5 show embodiments of components of a magnetic resonance tool 100 including a permanent magnet array 102 and at least one RF antenna assembly configured to transmit and/or receive magnetic resonance signals. FIG. 4 shows an example of an azimuthal Halbach array and FIG. 5 shows an example of a pie Halbach array. The permanent magnet arrays 102 generate a magnetic field $B_0$ having a magnetic flux in the azimuthal direction in the front of the tool and in the x-y plane, with ideally no or minimal z-directed fields. Magnetic field orientations are shown in FIG. 4 and FIG. 5 as a series of arrows.

The RF antenna assembly is configured to emit an oscillating magnetic field $B_1$ within a given frequency range. In one embodiment, the tool 100 includes an antenna configured as a loop coil 104 having a rectangular path and generally conforming to the exterior surface of the side of the array 102 (perpendicular to the x-y plane). The loop coil 104 emits a magnetic field $B_1$ that is generally oriented in a radial direction along the central coil axis. The directions of the $B_1$ fields are shown with arrow plots in FIG. 4 and FIG. 5.

Figure 6:
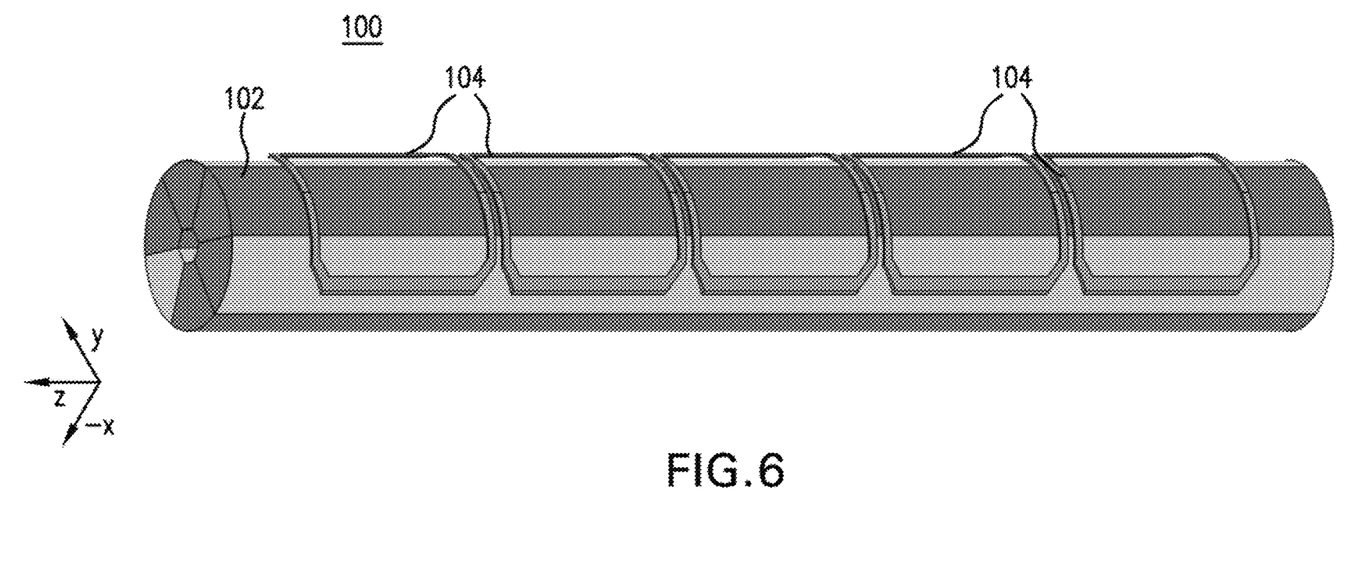
FIG. 6 depicts components of an embodiment of an NMR measurement apparatus that includes an array of antennas for transmission and reception, in combination with an array of magnets for generating a static field in the formation.

In one embodiment, the antenna includes a combination of one or more loop coils extended along the length of the magnet array 102 (i.e. the longitudinal direction). FIG. 6 shows an exemplary configuration of a NMR apparatus including a permanent magnet array and a RF antenna assembly used to extend sensitivity.

FIG. 4 and FIG. 5 show embodiments of an NMR apparatus that includes a magnet assembly having an array of magnets in a semi-cylindrical configuration and having an azimuthal static field orientation in front of the tool, i.e. facing the formation volume on interest. The antenna assembly includes a loop coil 104, which is positioned azimuthally so that the loop coil's interior magnetic field is directed toward a volume of interest within the formation. The magnetic fields $B_0$ of the magnet arrays have directions that are largely orthogonal to those produced by the RF antennas.

The various components of the antenna assembly may be arranged in different ways, depending on considerations such as directionality and the distribution of the $B_0$ field. For example, an alternative antenna configuration would be required to produce fields orthogonal to those shown in embodiment 66 of FIG. 3.

Magnetic resonance measurement apparatuses may include an array of antenna assemblies distributed about the tool circumference. Each antenna assembly may be used to generate $B_1$ fields so that a larger volume of interest can be interrogated and to improve the vertical resolution and or SNR of the measurement.

For example, FIG. 6 shows a multiple element antenna structure distributed along the length of a magnet array assembly. The multiple element structure provides unique sensitivities along the measurement apparatus. The RF antenna array structure may include distinct transmitting assemblies, receiving assemblies, or assemblies suited for transmission and reception.

Figure 7:
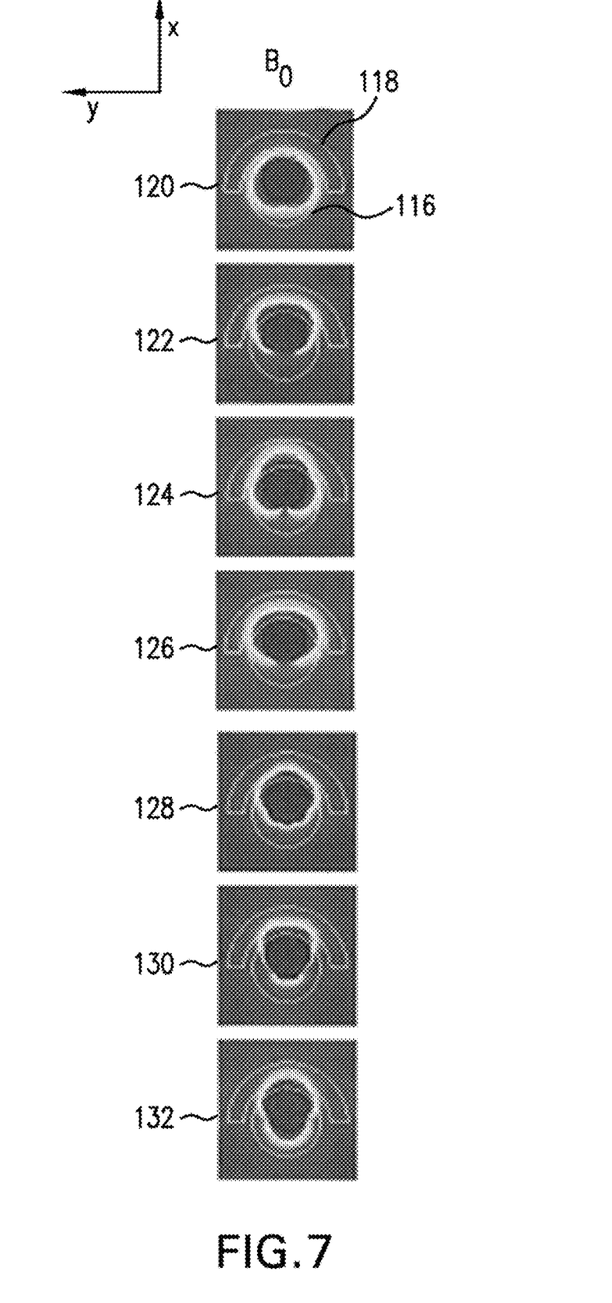
FIG. 7 depicts static magnetic field maps resulting from exemplary magnet array assemblies and an illustration of the field locations with respect to the borehole and the formation volume of interest.

FIG. 7 includes field maps showing the static fields produced by various embodiments, and demonstrates various advantageous aspects of such embodiments. Multiple circular and linear magnet arrays were compared to conventional unidirectional magnets of equivalent cross-sectional area in terms of field strength in the formation volume of interest (higher fields are better) and in the borehole (lower fields preferred). The maps are also shown in relation to a borehole 116 and a volume of interest 118 in a region of a formation surrounding the borehole 116. Row 120 shows a $B_0$ field map associated with a tool having a unidirectional magnet assembly, and is provided for purposes of comparison. Rows 122, 124 and 126 show field maps for tools including the pie-shaped array 64, the radial array 66, the azimuthal array 68, respectively. Rows 128, 130 and 132 show field maps for tools including the linear arrays 70, 72 and 74, respectively.

Results have indicated that tools having magnet array embodiments described herein are superior to other magnet configurations (e.g., unidirectional assemblies) in terms of their applicability for enhancing the overall sensitivity of NMR measurements in NMR well logging. As shown in FIG. 7, such embodiments have a significantly reduced $B_0$ strength toward the largest unoccupied borehole area relative to the unidirectional configuration, as well as a larger magnetic field strength in the formation volume of interest.

Although the embodiments described herein are primarily comprised of permanent magnets, it is envisioned that high-strength external magnetic fields could also be produced by electromagnets assembled in an otherwise similar magnet array.

The measurement apparatuses and magnet assemblies described herein may be used in various methods for estimating formation characteristics. An exemplary method includes taking downhole NMR measurements as part of wireline well logging and/or LWD operation. The method may be performed in conjunction with the system 10 and/or embodiments of the NMR apparatus, but is not limited thereto. The method includes one or more stages described below. In one embodiment, the method includes the execution of all of the stages in the order described. However, certain stages may be omitted, stages may be added, or the order of the stages changed.

In a first stage, a NMR or other magnetic resonance measurement tool is deployed into a borehole. In one embodiment, the tool (e.g., the tool 14) is deployed as part of an open hole wireline operation, or during drilling as part of a LWD operation. The tool includes a permanent magnet array having a rotating or alternating pattern of orientations as described above.

In a second stage, a static magnetic field $B_0$ is generated in the surrounding formation volume, and a radiofrequency (RF) or other pulsed signal is transmitted from at least one transmitting antenna, which in turn generates an oscillating magnetic field $B_1$ in the volume of interest. At least one receiving antenna detects NMR signals from the volume in response to the interaction between the nuclear spins of interest and the static and oscillating magnetic fields, and generates raw NMR data. The raw NMR data includes spin echo trains measured at a plurality of depths. NMR data is generated at multiple depths, during which the tool may be moving or stationary. In one embodiment, data is generated at a sufficient number of depths so that a continuous or near-continuous NMR log can be generated.

In a third stage, the NMR data is analyzed to estimate characteristics of the formation. For example, the spin echo data is converted to a distribution of $T_2$ relaxation times. $T_2$ distributions can then be used to estimate permeability and fluid properties, or to perform fluid typing or more advanced petrophysical analyses.

The apparatuses, systems and methods described herein have various advantages over prior art apparatuses and techniques, including increased measurement SNR, improved vertical resolution, and increased logging speed.

For example, embodiments of the measurement apparatus described herein improve $B_0$ magnetic field strength in a formation volume of interest while minimizing the $B_0$ field in the borehole in which the apparatus is deployed. Other advantages include the ability to construct smaller diameter tools, with performance consistent with tools having larger industry-standard outer diameters for wireline NMR logging. Smaller tools could give access to more wells and reduce the potential for tool stick.

Unconventional reservoirs, characterized by low permeability rocks and fast $T_2$ relaxation, are the target of many logging and exploration operations, and the exploitation of such reservoirs is expected to increase in the future. Embodiments described herein exhibit increased sensitivity relative to prior art techniques, which can facilitate accurate evaluation of unconventional reservoirs, and enhance fluid typing capabilities.

Logging speed is an important performance specification due to its relationship to cost. Logging speed is directly limited by SNR since insufficient data quality must be compensated by signal stacking (averaging), which improves SNR according to the square root of the number of stacked data sets, but substantially sacrifices efficiency in terms of logging speed. The improved SNR generated by the embodiments described herein is further advantageous in that it allows for increases in logging speed.

The depth of investigation (DOI) is limited by a combination of permanent magnet strength and antenna sensitivity. Embodiments described herein provide magnetic fields that could improve the DOI into a volume of interest (shown in FIG. 7), which can help to reduce the influence of a mud filtrate invasion zone. The embodiments can thus facilitate measurement (e.g., of porosity and permeability) with higher accuracy in formations containing mud filtrate, relative to prior art configurations that have a shallower DOI. Two dimensional fluid typing is also enhanced in the high $B_0$ field gradient proximal to the primary fields generated by the magnet array.

In connection with the teachings herein, various analyses and/or analytical components may be used, including digital and/or analog subsystems. The system may have components such as a processor, storage media, memory, input, output, communications link (wired, wireless, pulsed mud, optical or other), user interfaces, software programs, signal processors and other such components (such as resistors, capacitors, inductors, etc.) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user, or other such personnel, in addition to the functions described in this disclosure.

One skilled in the art will recognize that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention.

What is claimed is:

1. A nuclear magnetic resonance apparatus for estimating properties of an earth formation, the apparatus comprising:
   a carrier configured to be deployed in a borehole in the earth formation;
   at least one transmitting assembly disposed in the carrier and configured to generate an oscillating magnetic field in a volume of interest within the earth formation;
   at least one receiving assembly disposed in the carrier and configured to detect a nuclear magnetic resonance (NMR) signal originating in the volume of interest; and
   a magnet assembly disposed in the carrier and configured to generate a static magnetic field in the formation from a primary side of the magnet assembly, the magnet assembly including an array of longitudinally elongated magnets having a rotating pattern of magnetic orientations, wherein the magnetic orientations of adjacent ones of the longitudinally elongated magnets differ by less than 180 degrees, the array configured to generate the static magnetic field in the volume of interest, the static magnetic field strength being higher at the primary side of the magnet assembly, which is on a first side of an exterior surface of the array of longitudinally elongated magnets of the magnetic assembly, than the magnetic field strength at a side of the magnet assembly that is opposite the primary side and is on a second side, opposite the first side, of the exterior surface of the array of longitudinally elongated magnets of the magnetic assembly.

2. The apparatus of claim 1, wherein the array of longitudinally elongated magnets has a rotating pattern of magnetic orientations in a transverse plane perpendicular to a longitudinal axis of the magnet assembly.

3. The apparatus of claim 1, wherein the magnet assembly is a cylindrical or semi-cylindrical structure, and the array is a linear array of the longitudinally elongated magnets forming the structure.

4. The apparatus of claim 1, wherein the array is a circumferential array of the longitudinally elongated magnets, the array following a circular or semi-circular path, the rotating pattern of magnetic orientations configured to generate a strong static magnetic field around the exterior surface of the array and a weak or minimal magnetic field in the center of the array.

5. The apparatus of claim 1, wherein the magnet array includes a pattern of alternating magnet segments that produces a primary static magnetic field orientation directed radially toward or away from the magnet assembly.

6. The apparatus of claim 4, wherein the magnet array includes a pattern of alternating magnet segments that produces a primary static magnetic field orientation directed along a path that is tangential to the circular or semicircular circumference of the magnet assembly perimeter.

7. The apparatus of claim 1, wherein the array is an array of permanent magnets.

8. The apparatus of claim 1, wherein the array is an array of electromagnets.

9. The apparatus of claim 1, wherein the array includes a plurality of segments, the plurality of segments including a plurality of magnet segments and at least one segment is at least one of a soft magnetic material, a void space and a nonmagnetic material.

10. A method of estimating properties of an earth formation, the method comprising:
deploying a carrier into a borehole in the earth formation;
generating an oscillating magnetic field in a volume of interest within the earth formation by at least one transmitting assembly disposed in the carrier; and
generating a static magnetic field by a magnet assembly disposed in the carrier, the static magnetic field generated from a primary side of the magnet assembly into the volume of interest, the magnet assembly including an array of longitudinally elongated magnets having a rotating pattern of magnetic orientations, wherein the magnetic orientations of adjacent ones of the longitudinally elongated magnets differ by less than 180 degrees, the static magnetic field strength being higher at the primary side of the magnet assembly, which is on a first side of an exterior surface of the array of longitudinally elongated magnets of the magnetic assembly, than the magnetic field strength at a side of the magnet assembly that is opposite the primary side and is on a second side, opposite the first side, of the exterior surface of the array of longitudinally elongated magnets of the magnetic assembly;
detecting a nuclear magnetic resonance (NMR) signal by at least one receiver assembly; and
estimating the properties of the earth formation based on the detected signal.

11. The method of claim 10, wherein the array of longitudinally elongated magnets has a rotating pattern of magnetic orientations in a transverse plane perpendicular to a longitudinal axis of the magnet assembly.

12. The method of claim 10, wherein the magnet assembly is a cylindrical or semi-cylindrical structure, and the array is a linear array of the longitudinally elongated magnets forming the structure.

13. The method of claim 10, wherein the array is a circumferential array of the longitudinally elongated magnets, the array following a circular or semi-circular path, the rotating pattern of magnetic orientations configured to generate a strong static magnetic field around the exterior surface of the array and a weak or minimal magnetic field in the center of the array.

14. The method of claim 13, wherein the magnet array includes a pattern of alternating magnet segments that produces a primary static magnetic field orientation directed radially toward or away from the magnet assembly.

15. The method of claim 13, wherein the magnet array includes a pattern of alternating magnet segments that produces a primary static magnetic field orientation directed along a path that is tangential to the circular or semicircular circumference of the magnet assembly perimeter.

16. The method of claim 13, wherein generating the oscillating magnetic field includes generating orthogonally oriented magnetic fields by an antenna coil in the at least one transmitting assembly.

17. The method of claim 10, wherein the array is an array of permanent magnets.

18. The method of claim 10, wherein the array is an array of electromagnets.

19. The method of claim 10, wherein the array includes a plurality of segments, the plurality of segments including a plurality of magnet segments and at least one segment is at least one of a soft magnetic material, a void space and a nonmagnetic material.

* * * * *